US009609743B2

(12) United States Patent
Funahashi et al.

(10) Patent No.: US 9,609,743 B2
(45) Date of Patent: Mar. 28, 2017

(54) ELECTRONIC DEVICE MOUNTING SUBSTRATE, ELECTRONIC APPARATUS, AND IMAGING MODULE

(71) Applicant: KYOCERA Corporation, Kyoto-shi, Kyoto (JP)

(72) Inventors: Akihiko Funahashi, Kyoto (JP); Kanae Horiuchi, Kyoto (JP); Yousuke Moriyama, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 39 days.

(21) Appl. No.: 14/412,196

(22) PCT Filed: Jan. 31, 2014

(86) PCT No.: PCT/JP2014/052268
§ 371 (c)(1),
(2) Date: Dec. 30, 2014

(87) PCT Pub. No.: WO2014/119729
PCT Pub. Date: Aug. 7, 2014

(65) Prior Publication Data
US 2016/0007447 A1 Jan. 7, 2016

(30) Foreign Application Priority Data
Jan. 31, 2013 (JP) ................................ 2013-016832

(51) Int. Cl.
*H05K 1/02* (2006.01)
*H05K 1/03* (2006.01)
(Continued)

(52) U.S. Cl.
CPC ..... *H05K 1/0271* (2013.01); *H01L 27/14618* (2013.01); *H05K 1/0306* (2013.01);
(Continued)

(58) Field of Classification Search
CPC .... H01L 23/00–23/66; H01L 27/14618; H01L 2224/16225; H01L 2224/48227;
(Continued)

(56) References Cited

U.S. PATENT DOCUMENTS 6,232,655 B1 * 5/2001 Sugimura ............. H01L 23/482
257/690
7,345,362 B2 * 3/2008 Murakami ............... H01L 21/50
257/660
(Continued)

FOREIGN PATENT DOCUMENTS

JP 2006-201427 A 8/2006
JP 2007-173650 A 7/2007
(Continued)

OTHER PUBLICATIONS

International Search Report dated Apr. 22, 2014 issued for International Application No. PCT/JP2014/052268.

*Primary Examiner* — Dennis Hogue
(74) *Attorney, Agent, or Firm* — Procopio Cory Hargreaves and Savitch LLP

(57) ABSTRACT

There are provided an electronic device mounting substrate and an electronic apparatus which are capable of miniaturization. An electronic device mounting substrate includes: an insulating base including a frame section; an electrode pad disposed on an upper surface of the frame section; and a first conductor disposed on a side surface of the frame section, the first conductor being electrically connected to the electrode pad, the electrode pad extending over a side surface of the first conductor from the upper surface of the frame section. By suppressing separation of the first conductor from the insulating base by means of the electrode pad, disconnection at the first conductor can be suppressed.

20 Claims, 7 Drawing Sheets

(51) Int. Cl.

| | |
|---|---|
| *H01L 27/146* | (2006.01) |
| *H01L 33/62* | (2010.01) |
| *H01L 33/48* | (2010.01) |
| *H04N 5/225* | (2006.01) |
| *H05K 1/11* | (2006.01) |
| *H05K 1/18* | (2006.01) |

(52) U.S. Cl.
CPC ............ *H01L 33/486* (2013.01); *H01L 33/62* (2013.01); *H01L 2224/16225* (2013.01); *H01L 2224/48227* (2013.01); *H01L 2224/49175* (2013.01); *H04N 5/2254* (2013.01); *H05K 1/0298* (2013.01); *H05K 1/111* (2013.01); *H05K 1/183* (2013.01); *H05K 2201/10121* (2013.01); *H05K 2201/10378* (2013.01); *H05K 2201/2018* (2013.01)

(58) Field of Classification Search
CPC ......... H01L 2224/49175; H01L 33/486; H01L 33/62; H05K 1/0271; H05K 1/0298; H05K 1/0306; H05K 1/111; H05K 1/183; H05K 2201/10121; H05K 2201/10378; H05K 2201/2018; H04N 5/2254
See application file for complete search history.

(56) References Cited

U.S. PATENT DOCUMENTS

| | | | |
|---|---|---|---|
| 2011/0156187 A1* | 6/2011 | Tu | ..................... H01L 27/14618 257/432 |
| 2011/0281138 A1* | 11/2011 | Yoshioka | ................ H01L 24/24 428/815 |
| 2012/0193787 A1 | 8/2012 | Maitani et al. | |
| 2013/0058061 A1 | 3/2013 | Satoh et al. | |

FOREIGN PATENT DOCUMENTS

| | | | |
|---|---|---|---|
| JP | 2009-170499 A | | 7/2009 |
| JP | 2009170499 A | * | 7/2009 |
| JP | 2011-238799 A | | 11/2011 |
| JP | 2012-119619 A | | 6/2012 |
| JP | 2012-160512 A | | 8/2012 |

* cited by examiner (a)

(b)

(a)

(b)

(a)

(b)

(a)

(b)

(a)

(b)

(a)

(b)

ELECTRONIC DEVICE MOUNTING SUBSTRATE, ELECTRONIC APPARATUS, AND IMAGING MODULE

TECHNICAL FIELD

The present invention relates to an electronic device mounting substrate on which, for example, an imaging device of a charge coupled device (CCD) type or a complementary metal oxide semiconductor (CMOS) type, and the like, and a light emitting device such as a Light Emitting Diode (LED) are mounted, an electronic apparatus, and a imaging module.

BACKGROUND ART

In the related art, an electronic apparatus in which an imaging device of a CCD type or a CMOS type and a light emitting device such as an LED are mounted on an insulating base is known. Such an electronic apparatus has the insulating base having a frame section and an electronic device mounted on an inside of the frame section (for example, see Patent Literature 1). An electrode pad is disposed on an upper surface of the insulating base.

CITATION LIST

Patent Literature

Patent Literature 1: Japanese Unexamined Patent Publication JP-A 2006-201427

SUMMARY OF INVENTION

Technical Problem

Recently, with miniaturization of the electronic apparatus, since a width of the frame section of the insulating base has been narrowed, for example, an electronic device mounting substrate is deformed by heat or the like generated at the time of mounting the electronic device or during operation of the electronic device, and cracks may occur between a through conductor and a wall surface of the frame section. Therefore, a configuration in which a wall conductor is provided on the wall surface of the frame section instead of the through conductor is considered. In this case, for example, the electronic device mounting substrate is deformed by heat or the like generated at the time of mounting the electronic device or during operation of the electronic device, and thereby the wall conductor is easily separated from the insulating base. As a result, disconnection is prone to occur in the wall conductor and connection reliability of the wall conductor is decreased.

Solution to Problem

According to one aspect of the invention, an electronic device mounting substrate includes: an insulating base including a frame section; an electrode pad disposed on an upper surface of the frame section; and a first conductor disposed on a side surface of the frame section, the first conductor being electrically connected to the electrode pad, the electrode pad disposed on the upper surface of the frame section extending over a side surface of the first conductor from the upper surface of the frame section.

According to one aspect of the invention, an electronic apparatus includes: the electronic device mounting substrate having the configuration described above; and an electronic device mounted on the electronic device mounting substrate, the electronic device being electrically connected to the electrode pad.

According to one aspect of the invention, an imaging module includes: the electronic apparatus described above; a lid body disposed on the upper surface of the frame section through an adhesive; and a housing having a lens, disposed on an upper surface of the lid body.

According to one aspect of the invention, an electronic device mounting substrate includes: an insulating base; an electrode pad disposed in an outer periphery of an upper surface of the insulating base; and a second conductor disposed on a side surface of the insulating base, the second conductor being electrically connected to the electrode pad, the electrode pad disposed in the outer periphery of the upper surface of the insulating base extending over a side surface of the second conductor from the outer periphery of the upper surface of the insulating base.

Advantageous Effects of Invention

According to the electronic device mounting substrate of one aspect of the invention, even if heat or the like is generated at the time of mounting the electronic device or during the operation of the electronic device, it is possible to suppress separation of the first conductor from the frame section of the insulating base. Thus, it is possible to suppress disconnection of the first conductor and to improve connection reliability of the first conductor.

According to the electronic apparatus of one aspect of the invention, it is possible to suppress disconnection of the first conductor and to improve connection reliability of the first conductor.

According to the imaging module of one aspect of the invention, it is possible to suppress disconnection of the first conductor and to improve connection reliability of the first conductor.

According to the electronic device mounting substrate of one aspect of the invention, even if heat or the like is generated at the time of mounting the electronic device or during the operation of the electronic device, it is possible to suppress separation of the second conductor from the insulating base. Thus, it is possible to suppress disconnection of the second conductor and to improve connection reliability of the second conductor.

BRIEF DESCRIPTION OF DRAWINGS

FIG. 1(b) is a longitudinal cross-sectional view of the electronic apparatus taken along the line A-A illustrated in FIG. 1(a);

DESCRIPTION OF EMBODIMENTS

Hereinafter, exemplary embodiments of the invention will be described with reference to the drawings.

Figure 1:
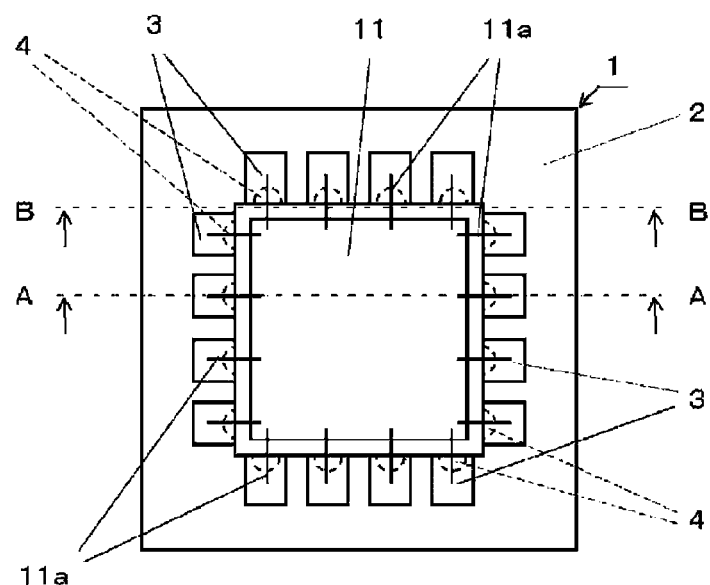
FIG. 1 (a) is a transparent plan view illustrating an electronic apparatus according to an embodiment of the invention.
Figure 1:
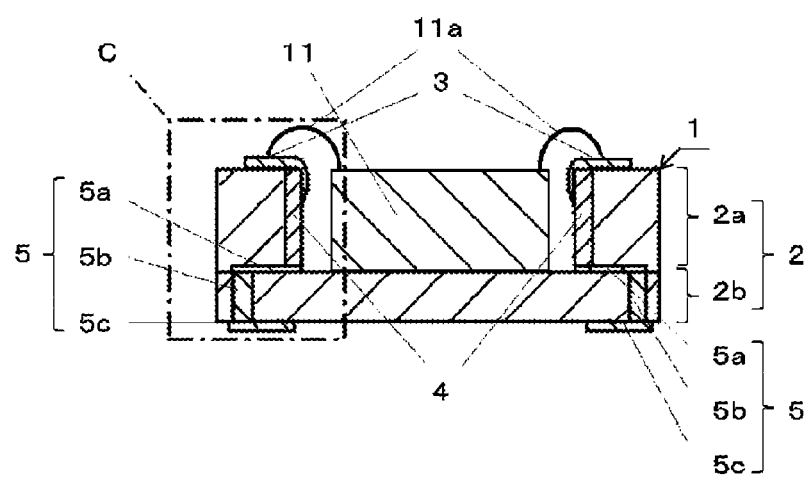
Figure 2:
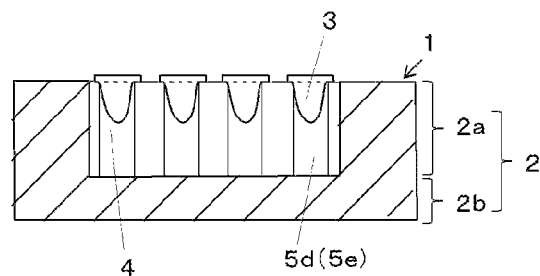
FIG. 2(a) is a longitudinal cross-sectional view of the electronic apparatus taken along the line B-B illustrated in FIG. 1(a)
FIG. 2(b) is a longitudinal cross-sectional view illustrating another example of FIG. 2(a)
Figure 2:
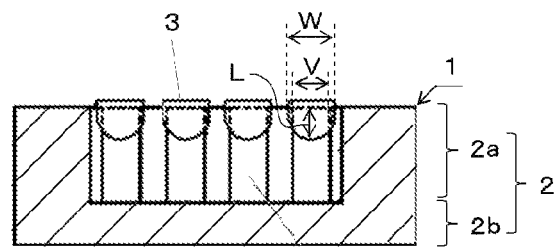

As illustrated in FIGS. 1(a), 1(b), and 2, an electronic apparatus according to the embodiment has an electronic device mounting substrate 1 and an electronic device 11 mounted on the electronic device mounting substrate 1.

The electronic device mounting substrate 1 has an insulating base 2 having a frame section 2a and a base section 2b disposed on an opposite side to an upper surface of the frame section 2a, a plurality of electrode pads 3 disposed on the upper surface of the frame section 2a, and a plurality of first conductors 4 which are disposed on an inner side surface of the frame section 2a and are electrically connected to the plurality of electrode pads 3, respectively. Furthermore, the insulating base 2 is provided with a wiring conductor 5.

In the example illustrated in FIG. 1, for example, the insulating base 2 has the frame section 2a and the base section 2b. The insulating base 2 has a convex composed of the inner side surface of the frame section 2a and an upper surface of the base section 2b. Moreover, the frame section 2a is an insulator having a through hole and the base section 2b may be construed as an insulator having no through hole.

For example, the insulating base 2 is formed by vertically laminating a plurality of substantially rectangular insulating layers made of electrically insulating ceramics such as aluminum oxide sintered body, mullite sintered body, silicon carbide sintered body, aluminum nitride sintered body, silicon nitride sintered body, glass ceramic sintered body or resin such as fluorine-base resin (plastics) including epoxy resin, polyimide resin, acrylic resin, phenol resin, polyester resin, or tetrafluoroethylene resin.

The plurality of electrode pads 3 are disposed on the upper surface of the frame section 2a of the insulating base 2 and are respectively electrically connected to each electrode of the electronic device 11 through a connection member such as a bonding wire 11a. In a case where the insulating base 2 is made of electrical insulation ceramics, the electrode pad 3 is formed of a metal material such as tungsten (W), molybdenum (Mo), manganese (Mn), silver (Ag) or copper (Cu). Furthermore, the material of the electrode pad 3 may be an alloy including one or more of the metal materials described above.

Furthermore, in a case where the insulating base 2 is made of resin, the electrode pad 3 is formed of a metal material such as copper (Cu), gold (Au), aluminum (Al), nickel (Ni), chromium (Cr), molybdenum (Mo) or titanium (Ti), or an alloy including one or more of the metal materials described above.

As in the example illustrated in FIGS. 1 and 2(a), the electrode pad 3 extends over a side surface of the first conductor 4 from the upper surface of the frame section 2a. More specifically, the electrode pad 3 is disposed so as to cover the upper surface of the first conductor 4 and the side surface thereof which are an upper end portion of the first conductor 4. As described above, since the electrode pad 3 is disposed around not only the upper surface of the first conductor 4 but also the side surface thereof, the first conductor 4 is configured to be sandwiched between the inner side surface of the frame section 2a and the electrode pad 3. Thus, in a case where heat or the like is generated at the time of mounting the electronic device 11 or during operation of the electronic device 11, separation of the first conductor 4 the insulating base 2 can be suppressed, and disconnection can be less prone to occur. Furthermore, in the example illustrated in FIG. 2(a), since the electrode pad 3 is also disposed on the upper surface of the first conductor 4, separation of the first conductor 4 from the insulating base 2 can be favorably suppressed.

In the example illustrated in FIG. 2(b), the electrode pad 3 extends over the side surface of the first conductor 4 and the inner side surface of the frame section 2a from the upper surface of the frame section 2a. In this case, since the electrode pad 3 is firmly bonded to the frame section 2a, and as a result, separation of the first conductor 4 from the insulating base 2 can be further suppressed by the electrode pad 3, which is preferable.

Furthermore, in the example illustrated in FIG. 2(b), a width of the electrode pad 3 is greater than a width of the first conductor 4 in the inner side surface of the frame section 2a. In this case, separation of the first conductor 4 from the insulating base 2 can be further suppressed, which is preferable.

For example, a length L (height direction of the first conductor 4) of the electrode pad 3 covering the upper end portion of the first conductor 4 from the upper surface of the frame section 2a may be 10 μm or more, and a width W of the electrode pad 3 may be greater than a width V of the first conductor 4 by 10 μm or more respectively on one side.

Furthermore, it is preferable that the electrode pad 3 and the first conductor 4 contain glass, respectively, and glass extending over a joining interface between the electrode pad 3 and the first conductor 4 is included. In this case, a bonding force between the electrode pad 3 and the first conductor 4 can be improved, and separation of the first conductor 4 can be further suppressed.

Furthermore, it is preferable that the electrode pad 3 and the frame section 2a contain glass, respectively, and glass extending over a joining interface between the electrode pad 3 and the frame section 2a is included. In this case, a bonding force between the electrode pad 3 and the frame section 2a can be improved, and separation of the electrode pad 3 from the frame section 2a can be further suppressed. As a result, separation of the first conductor 4 from the frame section 2a can be suppressed.

Furthermore, as in the example illustrated in FIG. 2(b), it is preferable that the length L of a portion in the electrode pad 3 on the inner side surface of the first conductor 4 is a half or less of the thickness (height) of the frame section 2a. Generally, the electrode pad 3 is formed by applying and firing electrode paste, but according to the configuration, since the electrode paste of the electrode pad 3 applied to the inner side surface of the frame section 2a is too long, it is possible to suppress occurrence of electrical short-circuiting by the contact of the electrode paste with the adjacent first conductor 4.

The first conductor 4 is disposed on a side surface of the frame section 2a and is electrically connected to the electrode pad 3.

In the example illustrated in FIG. 1(a), the first conductor 4 is disposed on the inner side surface of the frame section 2a. Furthermore, as illustrated in FIG. 1(a), the inner side surface of the frame section 2a is provided with a recess in a plan view thereof, and the first conductor 4 is disposed on an inside of the recess. As illustrated in FIG. 1(b), the recess extends over the upper surface of the base section 2b from the upper surface of the frame section 2a. The first conductor 4 is formed in a shape which cuts a circle portion such as a semicircular shape in a plan view and is exposed to the inner side surface of the frame section 2a.

Moreover, in a case where the insulating base 2 is formed of electrical insulation ceramics, the first conductor 4 is formed of the metal material similar to the electrode pad 3.

Furthermore, for example, the insulating base 2 is provided with the wiring conductor 5 which is electrically connected to the frame section 2a, the base section 2b, and the first conductor 4, and is led out to a lower surface of the base section 2b. The wiring conductor 5 includes an internal wiring 5a which is electrically connected to the first conductor 4, a through conductor 5b which passes through the base section 2b in a thickness direction thereof and is electrically connected to the internal wiring 5a, and an external terminal 5c which is disposed on the lower surface of the base section 2b and is electrically connected to the through conductor 5b. Thus, the electrode pad 3 is electrically connected to an external circuit substrate (not illustrated) through the first conductor 4 and the wiring conductor 5.

Moreover, in a case where the insulating base 2 is formed of electrical insulation ceramics, the wiring conductor 5 is formed of the metal material similar to the electrode pad 3. Furthermore, the wiring conductor 5 is disposed so as to lead out to the lower surface of the insulating base 2 in the configuration described above, but, for example, may be disposed so as to lead out to the side surface or the upper surface of the insulating base 2.

Furthermore, in a case where the insulating base 2 is formed of resin, the first conductor 4 and the wiring conductor 5 are formed of a metal material such as copper, gold, aluminum, nickel, chromium, molybdenum or titanium, or an alloy including one or more of the metal materials described above.

Figure 3:
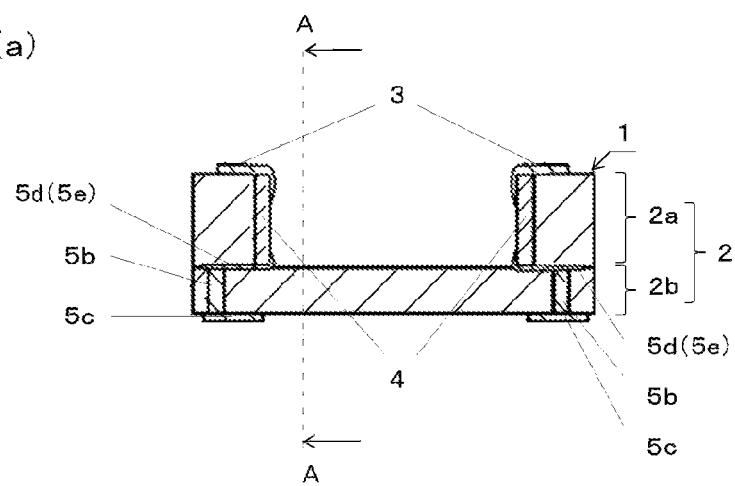
FIG. 3(a) is a longitudinal cross-sectional view illustrating a modified example of an electronic device mounting substrate illustrated in FIG. 1(b)
FIG. 3(b) is a longitudinal cross-sectional view of the electronic device mounting substrate taken along the line A-A illustrated in FIG. 3(a)
Figure 3:
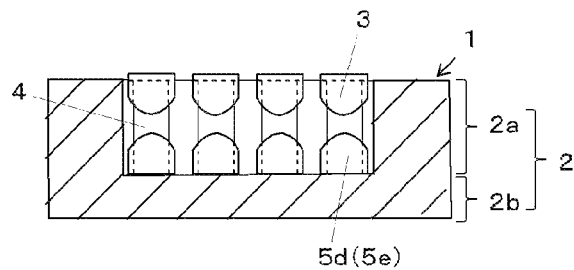

In the example illustrated in FIG. 3, the insulating base 2 includes the frame section 2a and the base section 2b disposed on the opposite side to the upper surface of the frame section 2a, and has a wiring layer 5d between the frame section 2a and the base section 2b. The wiring layer 5d extends over the side surface of the first conductor 4 from between the frame section 2a and the base section 2b. More specifically, the wiring layer 5d is provided so as to cover the lower surface of the first conductor 4 and the side surface thereof which are a lower end portion of the first conductor 4. As described above, since the wiring layer 5d is provided around not only the lower surface of the first conductor 4 but also the side surface thereof, the first conductor 4 is configured to be sandwiched between the inner side surface of the frame section 2a and the wiring layer 5d. For example, according to such a configuration, if heat or the like is generated at the time of mounting the electronic device 11 or during operation of the electronic device 11, separation of the first conductor 4 from the lower end of the inner side surface of the frame section 2a can be suppressed, and disconnection can be further less prone to occur in the first conductor 4. Furthermore, since the wiring layer 5d is provided so as to hold the lower surface and the lower portion of the side surface of the first conductor 4, separation of the first conductor 4 from the lower end of the inner side surface of the frame section 2a can be further preferably suppressed.

Furthermore, in the example illustrated in FIG. 3(b), if a width of the wiring layer 5d is greater than the width of the first conductor 4 in the inner side surface of the frame section 2a, separation of the first conductor 4 from the insulating base 2 can be further suppressed, which is preferable.

For example, a length (height direction of the first conductor 4) of the wiring layer 5d covering the lower portion of the side surface of the first conductor 4 from the upper surface of the frame section 2b may be 10 μm or more, and a width of the wiring layer 5d may be greater than the width of the first conductor 4 by 10 μm or more respectively on one side.

Furthermore, an insulating layer 5e may be disposed between the frame section 2a and the base section 2b instead of the wiring layer 5d and may extend over the side surface of the first conductor 4 from between the frame section 2a and the base section 2b. Moreover, in a case where the insulating layer 5e is disposed, the internal wiring 5a connecting the first conductor 4 and the through conductor 5b may be disposed separately.

Furthermore, similar to the wiring layer 5d, the insulating layers 5e may be disposed respectively in several positions so as to respectively cover the lower end portions of the plurality of first conductors 4, or formed widely so as to cover the lower end portions of the plurality of first conductors 4, and thereby for example, may cover an entirety of the plurality of first conductors 4 in which one insulating layer 5d is disposed along the inner side surface of the frame section 2a.

The insulating layer 5e can be formed by forming metal paste for the first conductor 4 on a ceramic green sheet for the frame section 2a, printing the metal paste for the internal wiring 5a, and then applying ceramic paste for the insulating layer 5e on the lower surface of the ceramic green sheet for the frame section 2a so as to cover the metal paste for the first conductor 4 and the metal paste for the internal wiring 5a.

Moreover, for example, in a case where the insulating base 2 is formed of ceramics, the wiring layer 5d is formed of a metal material similar to the electrode pad 3. Furthermore, for example, in a case where the insulating base 2 is formed of ceramics, the insulating layer 5e is formed of electrical insulation ceramics similar to the insulating base 2.

Furthermore, it is preferable that the wiring layer 5d or the insulating layer 5e contains glass, the first conductor 4 contains glass, and the glass is provided so as to extend over a joining interface between the wiring layer 5d or the insulating layer 5e and the first conductor 4. In this case, a bonding force between the wiring layer 5d or the insulating layer 5e and the first conductor 4 can be improved, and separation of the first conductor 4 can be suppressed.

Furthermore, it is preferable that the wiring layer 5d or the insulating layer 5e contains glass, the frame section 2a contains glass, and the glass is disposed so as to extend over a joining interface between the wiring layer 5d or the insulating layer 5e and the frame section 2a. In this case, since a bonding force between the wiring layer 5d or the insulating layer 5e and the frame section 2a can be improved, separation of the electrode pad 3 from the frame section 2a is suppressed, and as a result, separation of the first conductor 4 from the frame section 2a can be suppressed.

In the examples illustrated in FIGS. 1 to 5, the upper surface of the first conductor 4 is on the same height level as that of the upper surface of the frame section 2a. Thus, the electrode pad 3 of the upper surface of the frame section 2a is easily connected to the first conductor 4 compared to a case where the upper surface of the first conductor 4 is lower than the upper surface of the frame section 2a. Thus, disconnection between the first conductor 4 and the electrode pad 3 is less prone to occur. Furthermore, the upper surface of the first conductor 4 may be on a higher height level than that of the upper surface of the frame section 2a.

Figure 4:
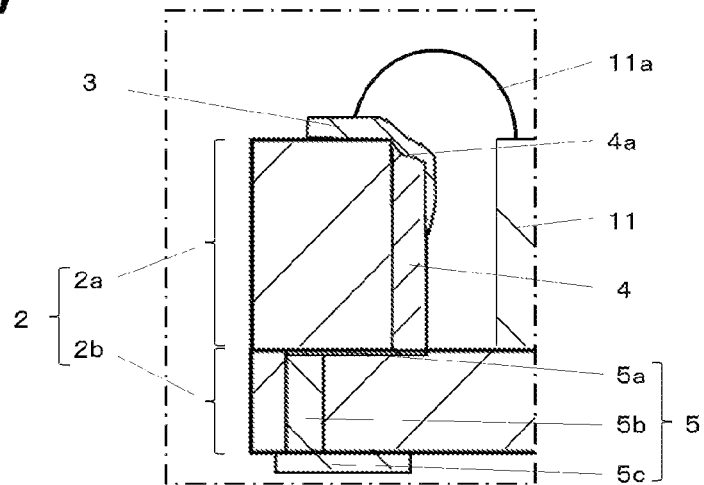
FIG. 4 is an enlarged longitudinal cross-sectional view illustrating a modified example of an electronic apparatus according to the embodiment of the invention.

In the example illustrated in FIG. 4, a recessed section 4a which does not reach the height level of the upper surface of the frame section 2a is provided on the upper surface of the first conductor 4. More specifically, the recessed section 4a has a shape in which a corner of the upper end of the first conductor 4 is removed. Such a configuration avoids that the thickness of the electrode pad 3 is thinned at the corner and around the corner of the first conductor 4, and the electrode pad 3 can be favorably bonded to the upper surface of the frame section 2a, the upper surface of the first conductor 4, and the upper portion of the side surface of the first conductor 4.

Furthermore, in the example illustrated in FIG. 4, a part of the upper surface of the first conductor 4 reaches the height level of the upper surface of the frame section 2a.

For example, in a case where the insulating base 2 is formed of electrical insulation ceramics, the electrode pad 3 and the first conductor 4 can be formed by applying metal paste on the upper surface of the metal paste for the first conductor 4 with adjusting an amount or viscosity, and the like of the metal paste so as to form the recessed section 4a, and then applying the metal paste for the electrode pad 3 on the upper surface of the ceramic green sheet for the frame section 2a so as to cover the recessed section 4a in a plan view.

As illustrated in FIG. 4, it is preferable that a depth of the recessed section 4a is smaller than the thickness of the electrode pad 3. For example, if the thickness of the electrode pad 3 is approximately 10 μm to 30 μm, the depth of the recessed section 4a is approximately 5 μm to 15 μm. In the example illustrated in FIG. 4, the depth of the recessed section 4a may be interpreted as a distance from the upper surface of the frame section 2a to the lowermost position of the recessed section 4a. Furthermore, the depth of the recessed section 4a may be interpreted as a distance from the upper surface of the first conductor 4 to the lowermost position of the recessed section 4a.

Furthermore, in the example illustrated in FIGS. 5(a) and 5(b), the first conductor 4 has a convex 4b protruding from the height level of the upper surface of the frame section 2a. By such a configuration, the convex 4b protruding from the first conductor 4 is disposed to cut into the electrode pad 3. Thus, for example, in a case where heat or the like is generated at the time of mounting the electronic device 11 or during the operation of the electronic device 11, separation of the first conductor 4 from the insulating base 2 is further suppressed, and disconnection can be less prone to occur.

Figure 5:
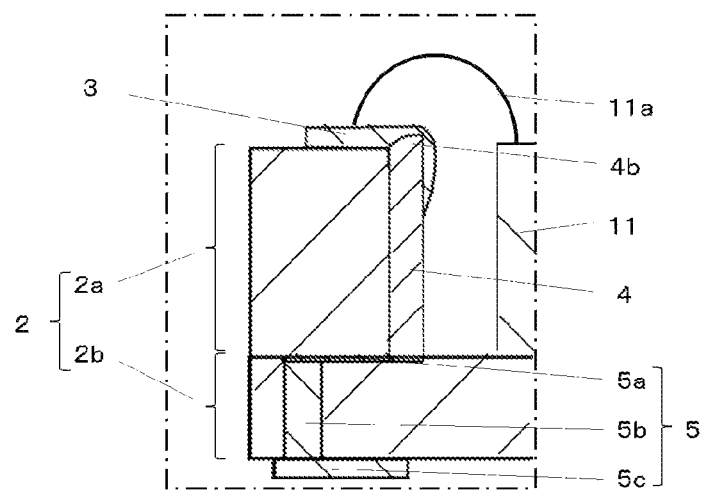
FIGS. 5(a) and 5(b) are enlarged longitudinal cross-sectional views illustrating modified examples of the electronic apparatus according to the embodiment of the invention.
Figure 5:
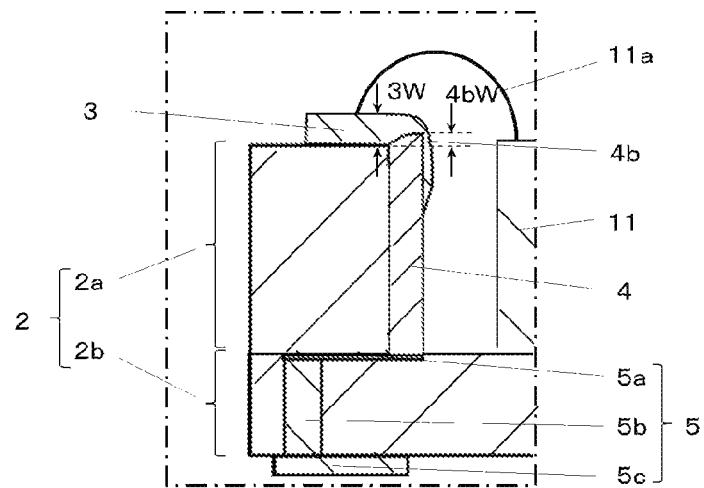

As in the example illustrated in FIG. 5, if the convex 4b has a sharp fan shape in a cross-sectional view, it is possible to easily cut into the electrode pad 3. For example, in such a convex 4b, if a height 4bW of the convex 4b is 2 μm to 10 μm, a thickness 3W of the electrode pad 3 is approximately 5 μm to 30 μm.

Such a convex 4b can be formed by adjusting an amount of the metal paste when charging the metal paste into the through hole or a pressure when charging the metal paste. In a case where the insulating base 2 is formed of electrical insulation ceramics, the first conductor 4 can be formed by protruding the upper surface of the metal paste for the first conductor 4 more than the upper surface of the ceramic green sheet for the frame section 2a by adjusting the amount or the viscosity of the metal paste, and then applying the metal paste for the electrode pad 3 on the upper surface of the ceramic green sheet for the frame section 2a so as to cover an entirety of the convex 4b in a plan view.

Furthermore, as described with reference to FIG. 5(b), the thickness 3W of the electrode pad 3 is greater than the height 4bW of the convex 4b. By such a configuration, with the same principle as the above description, for example, if heat or the like is generated at the time of mounting the electronic device 11 or during the operation of the electronic device 11, separation of the first conductor 4 from the insulating base 2 is further suppressed, and disconnection can be less prone to occur. It is possible to improve flatness of the electrode pad 3 by making the thickness 3W of the electrode pad 3 greater than the height 4bW of the convex 4b and to favorably establish the connection of the electrode pad 3 with electrical connection means such as the bonding wire 11a.

Furthermore, as in the example illustrated in FIG. 5, a part of the upper surface of the first conductor 4 may be on the same height level as that of the upper surface of the frame section 2a.

Figure 6:
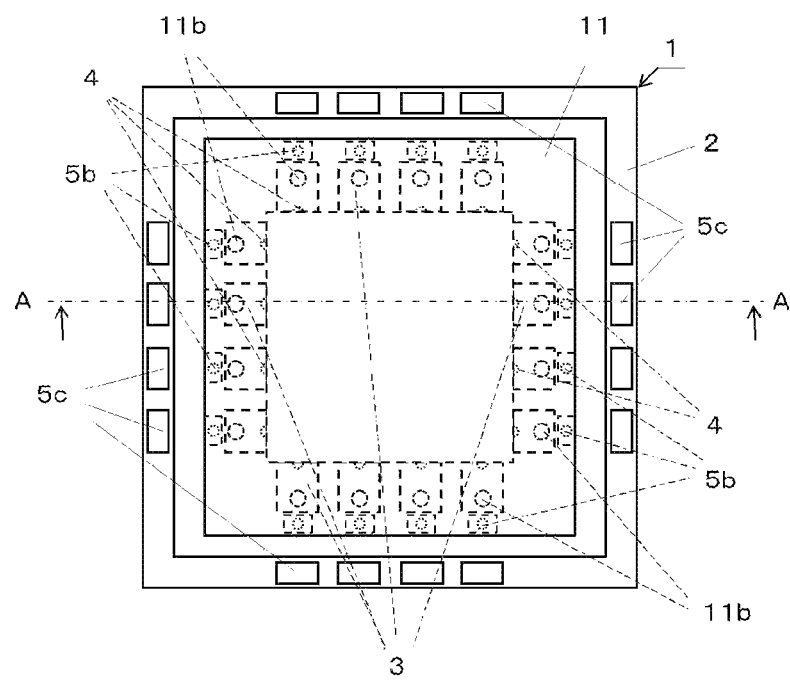
FIG. 6(a) is a transparent plan view illustrating an electronic apparatus according to the embodiment of the invention.
FIG. 6(b) is a longitudinal cross-sectional view of the electronic apparatus taken along the line A-A illustrated in FIG. 6(a)
Figure 6:
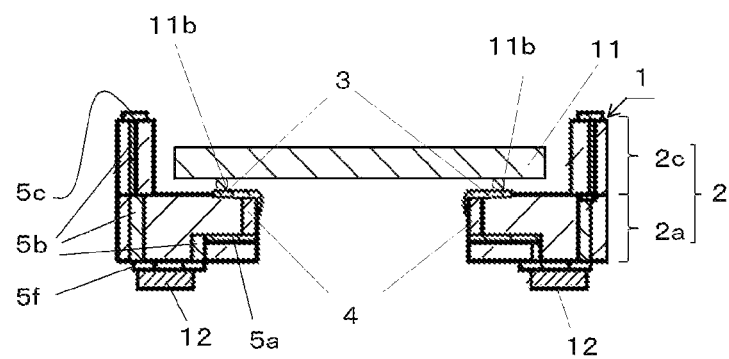

In the example of FIG. 6, the insulating base 2 does not have the base section 2b. In the example, the insulating base 2 is composed of a first frame section 2a and a second frame section 2c having a through hole greater than the through hole of the first frame section 2a. An upper surface of the first frame section 2a is bonded to a lower surface of the second frame section 2c.

A concave section is defined by the upper surface of the first frame section 2a and an inner side surface of the second frame section 2c in the insulating base 2. The electronic device 11 is housed in the concave section. Furthermore, the electronic device 11 is flip-chip mounted on the electrode pad 3 disposed on the upper surface of the first frame section 2a. When performing the flip-chip mounting, for example, each electrode of the electronic device 11 is electrically connected to the electrode pad 3 via a connection terminal 11b such as gold bump or solder.

Also in the example illustrated in FIG. 6, similar to the example illustrated in FIG. 1, the wiring conductor 5 is provided. One end of the wiring conductor 5 is electrically connected to the first conductor 4 and the other end thereof is led out to the upper surface of the second frame section 2c.

In the example illustrated in FIG. 6, the wiring conductor 5 has a surface wiring 5f in addition to the internal wiring 5a, the through conductor 5b, and the external terminal 5c.

The internal wiring 5a is a wiring conductor disposed inside the first frame section 2a, and one end of the internal wiring 5a is connected to the first conductor 4.

The through conductor 5b is disposed inside the first frame section 2a and the second frame section 2c. The first frame section 2a is provided with two through conductors 5b, an upper end of one through conductor 5b is connected to the internal wiring 5a, and a lower end thereof is exposed to the lower surface of the first frame section 2a and is connected to the surface wiring 5f. A lower end of the other through conductor 5b in the first frame section 2a is exposed to the lower surface of the first frame section 2a and is connected to the surface wiring 5f, and an upper end thereof is connected to the lower end of the through conductor 5b of the second frame section 2c. The upper end of the through conductor 5b of the second frame section 2c is exposed from the upper surface of the second frame section 2c.

The external terminal 5c is disposed on the upper surface of the second frame section 2c and is connected to the upper end of the through conductor 5b of the second frame section 2c.

One end of the surface wiring 5f is connected to the lower end of one through conductor 5b of the first frame section 2a, and the other end thereof is connected to the lower end of the other through conductor 5b of the first frame section 2a. Furthermore, the other electronic device 12 is connected to the lower surface of the surface wiring 5f.

As described above, the electronic device 11 connected to the electrode pad 3 is electrically connected to the external circuit substrate (not illustrated) through the first conductor 4 and the wiring conductor 5.

Also in this case, it is possible to apply the technical ideas illustrated in FIGS. 1 to 5. In the examples described above, for example, in a case where the electronic device 11 is the CCD type imaging device or the CMOS type imaging device, light from above the electronic apparatus is received by the electronic device 11. However, in FIG. 6, a light receiving section is positioned on the lower surface of the electronic device 11, and therefore the light from below the electronic apparatus is received by the electronic device 11.

Furthermore, in the example illustrated in FIG. 6, another electronic device 12 is disposed on the lower surface of the first frame section 2a. Examples of the other electronic device 12 include a chip capacitor, a resistance element, a semiconductor element, and a light emitting device such as an LED.

Furthermore, for example, a joint section between each electrode of the electronic device 11 and the electrode pad 3, and a joint section between each electrode of the other electronic device 12 and the surface wiring 5f may be covered by underfill. As the underfill, for example, resin such as epoxy resin is used. Thus, it is possible to make the electric connection of the electronic device 11 more reliable.

Moreover, for the electric connection between each electrode of the electronic device 11 and the plurality of electrode pads 3 and the electric connection between each electrode of the other electronic device 12 and the surface wiring 5f, a connection member formed of a conductive resin (anisotropic conductive resin and the like) may be used instead of using the connection terminal 11b such as a gold bump or the solder described above.

Next, a manufacturing method of the electronic device mounting substrate 1 of the embodiment will be described.

The insulating base 2 is formed of, for example, electrical insulation ceramics such as an aluminum oxide ($Al_2O_3$) sintered body, and for example, has the frame section 2a and the base section 2b. In a case where the insulating base 2 is made of aluminum oxide sintered body whose main component is aluminum oxide ($Al_2O_3$), powder of silica ($SiO_2$), magnesia (MgO), calcia (CaO), or the like as a sintering agent is added to powder of $Al_2O_3$, appropriate binder, solvent, and plasticizer are further added, and then a mixture thereof is kneaded, thereby preparing a slurry. Thereafter, a ceramic green sheet for a segmentable substrate is obtained by using by a molding method such as conventional well-known doctor blade method or calender roll method.

The electronic device mounting substrate 1 is produced by the following steps (1) to (6) using the ceramic green sheet.

The metal paste for the first conductor 4 is formed in the ceramic green sheet for the frame section 2a, and the metal paste for the through conductor 5b is formed in the ceramic green sheet for the base section 2b.

Here, a method for forming the metal paste 104 becoming the first conductor 4 in a ceramic green sheet 102a becoming the frame section 2a is described with reference to FIGS. 7(a) to 7(c).

Figure 7:
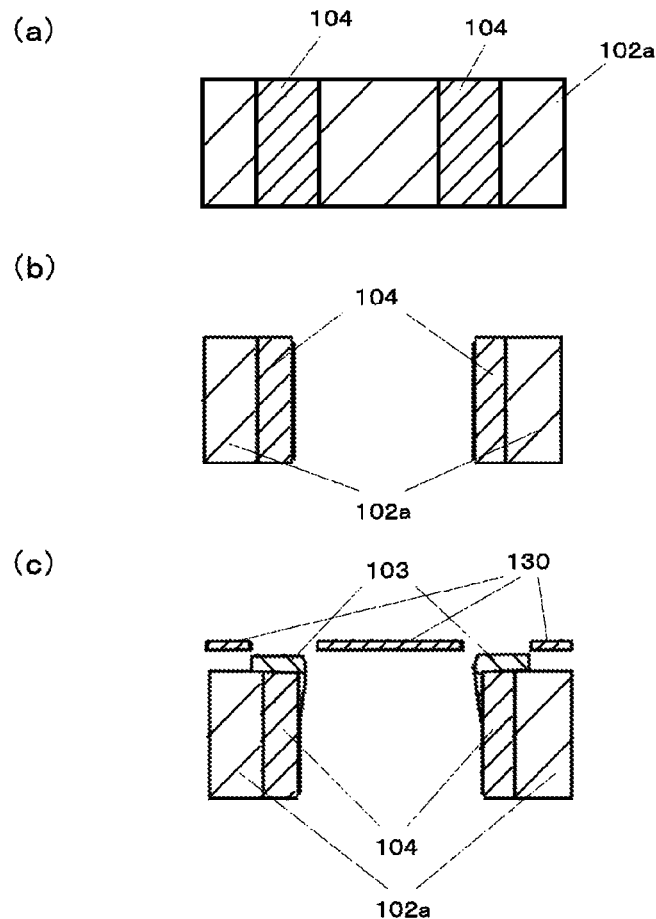
FIGS. 7(a) to 7(c) are longitudinal cross-sectional views illustrating a manufacturing method of a frame section of an electronic device mounting substrate according to the embodiment of the invention.

First, as an example illustrated in FIG. 7(a), after a through hole is formed in the ceramic green sheet 102a, metal paste 104 is charged into the through hole. For charging of the metal paste 104, a screen printing method or otherwise are used.

In addition, even though a top view of this step is not illustrated, for example, as the arrangement of the plurality of first conductors 4 in FIG. 1(a), a plurality of through conductors of the metal paste 104 are formed.

Moreover, the metal paste for the through conductor 5b is also formed in the ceramic green sheet for the base section 2b with the same method as the above description.

(2) Next, as an example illustrated in FIG. 7(b), punching is performed in the ceramic green sheet 102a, and the through hole is formed. The through hole formed here becomes an internal space of the frame section 2a.

Furthermore, when forming the through hole in this step, a part of the through conductor of the metal paste 104 is cut and removed. Thus, for example, as illustrated in FIG. 1(a), it is possible to form the first conductor 4 having the shape which cuts a circle portion in a plan view. Thus, for example, the metal paste 104 for the first conductor 4 becomes a semicircular shape in a plan view and is exposed to an inner side surface of the ceramic green sheet 102a.

Moreover, in the punching of this step, a punching process using a die or a laser process is used.

(3) Next, as illustrated in FIG. 7(c), metal paste 103 for the electrode pad 3 is formed so as to cover a portion becoming the upper end portion of the metal paste 104 over the side surface of the metal paste 104 from the upper surface of the ceramic green sheet 102a. For the formation of the metal paste 103, a printing mask 130 is used. An opening of the printing mask 130 extends toward further inside from the inner side surface of the ceramic green sheet 102a. A part of the metal paste 103 is formed by hanging on the side surface of the metal paste 104 by applying the metal paste 103 through such an opening. Thus, it is possible to form the electrode pad 3 over the side surface of the first conductor 4 from the upper surface of the frame section 2a.

(4) Next, after applying the metal paste for the internal wiring 5a and the external terminal 5c to respective ceramic green sheets, a ceramic green sheet stacked body is produced by laminating the respective ceramic green sheets.

(5) Next, the ceramic green sheet stacked body is fired at a temperature of approximately 1500° C. to 1800° C. In this step, it is possible to obtain the insulating base 2 in which the electrode pad 3, the first conductor 4, and the wiring conductor 5 are provided.

Moreover, the ceramic green sheet for a segmentable substrate may be formed in which a plurality of the insulating bases 2 are disposed. In this case, in the segmentable substrate, dividing grooves are formed along lines becoming outer edges of the electronic device mounting substrate 1. Next, the electronic device mounting substrate 1 formed of a plurality of pieces is obtained by dividing the segmentable substrate along the dividing grooves. For the division, a slicing method may be used.

Moreover, the dividing groove may be formed by making a hack whose depth is less than the thickness of the segmentable substrate using a slicing device after the firing. Furthermore, the dividing groove may be formed by pressing a cutter blade on the ceramic stacked body for the segmentable substrate, or forming the hack whose depth is less than the thickness of the stacked body using the slicing device.

In addition, the metal paste for the metal paste 103, the metal paste 104, and the wiring conductor 5 described above is prepared by adding an appropriate solvent and binder to a predetermined metal powder and kneading them, with the adjustment to appropriate viscosity. Furthermore, the metal paste may contain glass and ceramics in order to increase bonding strength with the insulating base 2.

As described above, in a case where the insulating base 2 is formed of electrical insulation ceramics, the predetermined metal paste is formed of a metal material such as tungsten (W), molybdenum (Mo), manganese (Mn), silver (Ag) or copper (Cu). Furthermore, the metal paste may be an alloy formed of a plurality of the metal materials described above.

Furthermore, in order to protect the electrode pad 3, the first conductor 4, and the external terminal 5*c* and to prevent oxidation thereof, a Ni plating layer having a thickness of 0.5 to 10 μm may be deposited on the surfaces of them. Furthermore, a gold (Au) plating layer having a thickness of 0.5 to 3 μm may be further deposited on the Ni plating layer.

Moreover, for example, in a case where the insulating base 2 is formed of resin, the insulating base 2 may be formed by performing a molding process by means of transfer molding or injection molding by using a mold such as to form the resin into a predetermined shape.

Furthermore, for example, the insulating base 2 may be a stacked body composed of a plurality of resin sheets formed of glass epoxy resin which are laminated. The resin sheet formed of the glass epoxy resin is formed by impregnating the resin into a base material formed of the glass fiber and then thermally curing the base material at a predetermined temperature.

For example, as the forming method of the electrode pad 3 and the like, a method of transferring a copper foil processed to a predetermined shape onto the resin sheet is included. Furthermore, the electrode pad 3 may be formed on the resin sheet using a sputtering method, a vapor deposition method, a plating method, or otherwise. Furthermore, as the forming method of the first conductor 4, a method of printing the metal paste on an inner wall of the through hole formed on the resin sheet in advance, or a plating method or otherwise is included.

Then, the insulating base 2 may be formed by laminating a plurality of resin sheets by bonding them with adhesive to each other.

Next, an electronic apparatus of the invention will be described with reference to FIG. 1. The electronic apparatus of the invention has the electronic device mounting substrate 1 and the electronic device 11.

As in the example illustrated in FIG. 1, the electronic device 11 is mounted on the electronic device mounting substrate 1. More specifically, the electronic device 11 is housed in the concave section formed by the inner side surface of the frame section 2*a* and the upper surface of the base section 2*b*.

The electronic device 11 is electrically connected to the electrode pad 3 through the connection member such as the bonding wire 11*a*. Moreover, in the example illustrated in FIG. 6, each electrode of the electronic device 11 is electrically connected to the electrode pad 3 by the connection terminal 11*b* such as a gold bump or the solder.

The electronic device 11 is electrically connected to the external circuit substrate through the electrode pad 3, the first conductor 4, and the wiring conductor 5 by mounting such an electronic apparatus on the external circuit substrate.

For example, the electronic device 11 is a CCD type imaging device or a CMOS type imaging device, a semiconductor device, an IC device, or a light emitting device such as an LED. Furthermore, the electronic device mounting substrate 1 on which the electronic device 11 is mounted is provided with a lid body which covers the concave section.

For example, in a case where the electronic device 11 is the light emitting device such as the LED, the CCD type imaging device, the CMOS type imaging device, or the like, as a material of the lid body, for example, a transparent body formed of glass, quartz, filter, and the like is used. Furthermore, for example, in a case where the electronic device 11 is the IC device, the semiconductor device, or the like, as the material of the lid body, for example, the transparent body described above or metal is used.

Furthermore, the shape of the lid body may be a flat plate or may a flat plate provided with an opening at a center thereof.

For example, as the connection material connecting between the electronic device 11 and a bottom surface of the concave section of the insulating base 2, a resin connection material such as a thermosetting resin is used. The connection material may contain metal particles. For example, as the connection material, a silver epoxy resin or the like is used.

Figure 8:
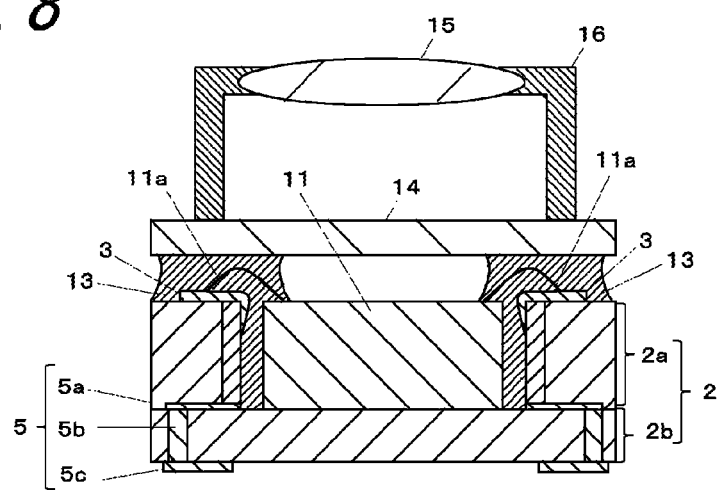
FIG. 8 is a longitudinal cross-sectional view of an imaging module according to the embodiment of the invention.

Next, an imaging module of the invention will be described with reference to FIG. 8. The imaging module has the electronic apparatus described above, a lid body 14, and a housing 16. The imaging device as the electronic device 11 is mounted on the electronic apparatus.

The lid body 14 is disposed on the upper surface of the frame section 2*a* through an adhesive 13. For example, the adhesive 13 is an insulating resin adhesive or the like. In the example illustrated in FIG. 8, part of the adhesive 13 is disposed on an outer periphery of the upper surface of the electronic device 11 (imaging device) and covers the bonding wire 11*a*. Furthermore, as in the example illustrated in FIG. 8, part of the adhesive 13 may enter between the inner wall surface of the frame section 2*a* and the side surface of the electronic device 11.

As a material of the lid body 14, for example, a transparent body formed of glass, quartz, filter, or the like is used.

The housing 16 is disposed on the upper surface of the lid body 14 and has a lens 15. In the example illustrated in FIG. 8, a lower end portion of the housing 16 is disposed in the outer periphery of the upper surface of the lid body 14. For the connection between the lid body 14 and the housing 16, for example, a resin adhesive or the like is used.

Since the imaging module of the invention has the electronic apparatus described above, the lid body 16 disposed on the upper surface of the frame section 2a through the adhesive 13, and the housing 16 disposed on the upper surface of the lid body 14 and having the lens 15, it is possible to reduce separation of the first conductor 4 in the frame section 2a.

Next, a modified example of an electronic apparatus according to the embodiment of the invention will be described with reference to FIG. 9. In the electronic apparatus of the embodiment illustrated in FIG. 9, the position of the first conductor 4 is different from that of the embodiment of FIG. 1.

Figure 9:
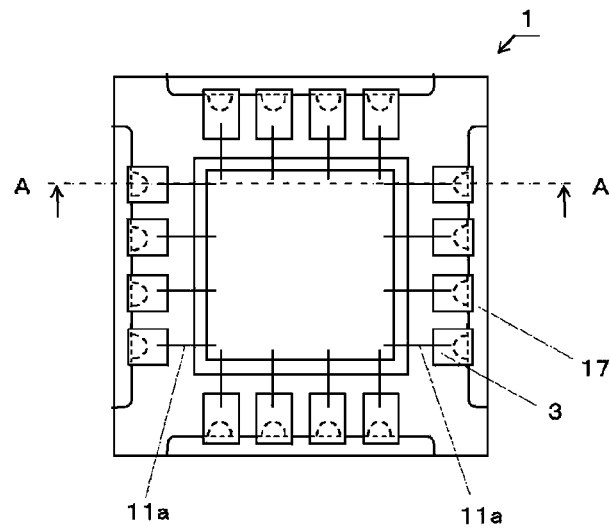
FIG. 9(a) is a transparent plan view illustrating another example of an electronic apparatus according to the embodiment of the invention.
FIG. 9(b) is a longitudinal cross-sectional view of the electronic apparatus taken along the line A-A illustrated in FIG. 9(a)
Figure 9:
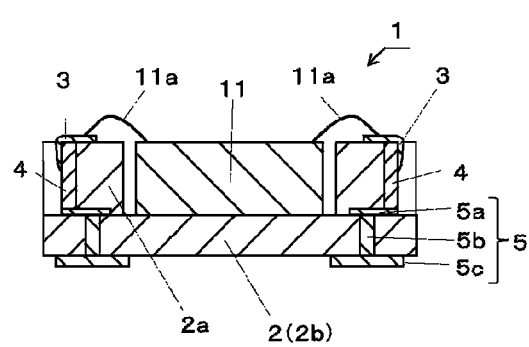

In the example illustrated in FIG. 9, the first conductor 4 is disposed on an outer side surface of the frame section 2a. In this case, since the first conductor 4 is away from the electronic device 11, the first conductor 4 is less prone to be affected by heat, and it is possible to suppress separation of the first conductor 4.

Furthermore, as in the example illustrated in FIG. 9, a notch 17 may be provided on the outer wall surface of the frame section 2a, and the first conductor 4 may be disposed on an inner surface of the notch 17.

Next, a modified example of the electronic apparatus according to the embodiment of the invention will be described with reference to FIG. 10.

Figure 10:
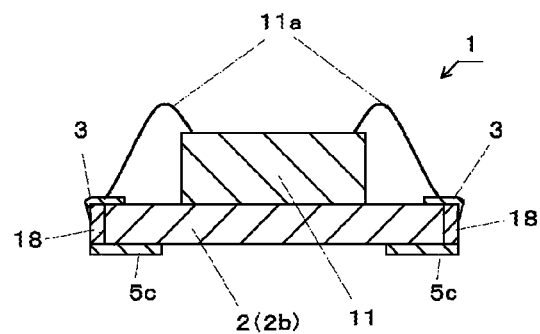
FIG. 10 is a longitudinal cross-sectional view illustrating a modified example of an electronic apparatus according to the embodiment of the invention.

The electronic apparatus of the embodiment illustrated in FIG. 10 is different from the embodiment of FIG. 1 in that the frame section 2a is not included. As in the example illustrated in FIG. 10, the insulating base 2 is formed only of the base section 2b.

Furthermore, the electronic apparatus of the embodiment illustrated in FIG. 10 is different from the embodiment of FIG. 1 even in that a second conductor 18 is included, not the first conductor 4. In the example illustrated in FIG. 10, the second conductor 18 is disposed on the side surface of the insulating substrate and is electrically connected to the electrode pad 3.

Furthermore, in the example illustrated in FIG. 10, the electrode pad 3 extends over the side surface of the second conductor 18 from the outer periphery the upper surface of the insulating base 2. According to the configuration, separation of the second conductor 18 from the insulating base 2 is suppressed by the electrode pad 3 similar to the first conductor 4.

Furthermore, in the example illustrated in FIG. 10, the electrode pad 3 extends over the side surface of the second conductor 18 and the side surface of the insulating base 2 from the upper surface of the insulating base 2. Thus, the second conductor 18 is further less prone to separate from the insulating base 2.

Next, a modified example of the electronic apparatus of the embodiment of the invention will be described with reference to FIG. 11. In the electronic apparatus of the embodiment illustrated in FIG. 11, the shape of the frame section 2a is different from that of the embodiment of FIG. 1.

Figure 11:
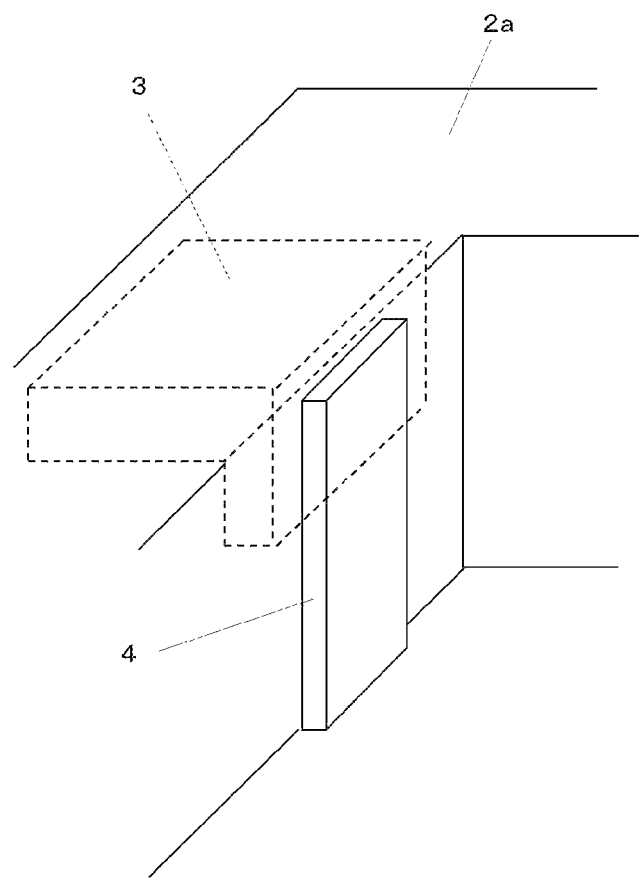
FIG. 11 is an enlarged perspective view illustrating a modified example of an electronic device mounting substrate according to the embodiment of the invention.

In the example illustrated in FIG. 11, the inner side surface of the frame section 2a is flat and the first conductor 4 is disposed on the flat side surface of the frame section 2a. More specifically, in the example illustrated in FIG. 11, contrary to the example illustrated in FIG. 1, since a recess is not provided on the inner side surface of the frame section 2a, the first conductor 4 is disposed on the flat inner side surface of the frame section 2a, not an inside of the recess.

In the example illustrated in FIG. 11, the first conductor 4 is flat and one main surface thereof abuts to the inner side surface of the frame section 2a and is bonded thereto.

In a case where such a first conductor 4 is formed, the metal paste having a plate shape is applied to the inner side surface of the green sheet becoming the frame section 2a provided with the through hole and then firing may be performed.

Furthermore, as illustrated in FIG. 9, even if the first conductor 4 is disposed on the outer side surface of the frame section 2a, the first conductor 4 may be a plate shape as illustrated in FIG. 11.

REFERENCE SIGNS LIST

1: Electronic device mounting substrate
2: Insulating base
2a: Frame section (First frame section)
2b: Base section
2c: Second frame section
3: Electrode pad
4: First conductor
5: Wiring conductor
5a: Internal wiring
5b: Through conductor
5c: External terminal
5d: Wiring layer
5e: Insulating layer
5f: Surface wiring
11: Electronic device
13: Adhesive
14: Lid body
15: Lens
16: Housing
17: Notch
18: Second conductor

The invention claimed is:

1. An electronic device mounting substrate, comprising:
an insulating base comprising a frame section;
an electrode pad disposed on an upper surface of the frame section; and
a first conductor disposed on a side surface of the frame section, the first conductor being electrically connected to the electrode pad,
the electrode pad disposed on the upper surface of the frame section extending over a side surface of the first conductor from the upper surface of the frame section,
wherein the electrode pad and the first conductor contain glass, respectively, and
the electronic device mounting substrate further comprising: glass extending over a joining interface between the electrode pad and the first conductor.

2. The electronic device mounting substrate according to claim 1,
wherein the electrode pad extending over the side surface of the first conductor from the upper surface of the frame section extends over the side surface of the frame section.

3. The electronic device mounting substrate according to claim 1,
wherein a width of the electrode pad is greater than a width of the first conductor in the side surface of the frame section.

4. The electronic device mounting substrate according to claim 1,
wherein the upper surface of the first conductor is on a same height level as that of the upper surface of the frame section or is on a higher height level than that of the upper surface of the frame section.

5. The electronic device mounting substrate according to claim 4,
wherein the first conductor has a convex protruding from the height level of the upper surface of the frame section.

6. The electronic device mounting substrate according to claim 5,
wherein a thickness of the electrode pad is greater than a height of the convex.

7. The electronic device mounting substrate according to claim 1,
wherein the first conductor has a recessed section which does not reach a height level of the upper surface of the frame section on the upper surface.

8. The electronic device mounting substrate according to claim 1,
wherein the insulating base comprises the frame section and a base section provided on an opposite side to the upper surface of the frame section,
wherein a wiring layer or an insulating layer is provided between the frame section and the base section, and
wherein the wiring layer or the insulating layer extends over the side surface of the first conductor from between the frame section and the base section.

9. The electronic device mounting substrate according to claim 8,
wherein a width of the wiring layer or the insulating layer is greater than a width of the first conductor in the side surface of the frame section.

10. The electronic device mounting substrate according to claim 1,
wherein a length of a portion in the electrode pad on the side surface of the first conductor is a half or less of the thickness of the frame section.

11. The electronic device mounting substrate according to claim 1,
wherein the first conductor is disposed on an inner side surface of the frame section.

12. The electronic device mounting substrate according to claim 11,
wherein the side surface of the frame section is provided with a recess in a plan view thereof, and the first conductor is disposed on an inside of the recess.

13. The electronic device mounting substrate according to claim 11,
wherein the side surface of the frame section is flat, and
wherein the first conductor is disposed on a flat side surface of the frame section.

14. The electronic device mounting substrate according to claim 1, wherein the first conductor is disposed on an outer side surface of the frame section.

15. The electronic device mounting substrate according to claim 1, further comprising:
a peripheral electrode pad disposed in an outer periphery of an upper surface of the insulating base; and
a second conductor disposed on a side surface of the insulating base, the second conductor being electrically connected to the peripheral electrode pad,
the peripheral electrode pad disposed in the outer periphery of the upper surface of the insulating base extending over a side surface of the second conductor from the outer periphery of the upper surface of the insulating base.

16. The electronic device mounting substrate according to claim 15,
wherein the peripheral electrode pad extends over the side surface of the second conductor and the side surface of the insulating base from the upper surface of the insulating base.

17. An electronic device mounting substrate, comprising:
an insulating base comprising a frame section;
an electrode pad disposed on an upper surface of the frame section; and
a first conductor disposed on a side surface of the frame section, the first conductor being electrically connected to the electrode pad,
the electrode pad disposed on the upper surface of the frame section extending over a side surface of the first conductor from the upper surface of the frame section,
wherein the electrode pad and the frame section contain glass, respectively, and
the electronic device mounting substrate further comprising: glass extending over a joining interface between the electrode pad and the frame section.

18. An electronic apparatus, comprising:
the electronic device mounting substrate according to claim 1; and
an electronic device mounted on the electronic device mounting substrate, the electronic device being electrically connected to the electrode pad.

19. The electronic apparatus according to claim 18, wherein the electronic device is an imaging device.

20. An electronic apparatus, comprising:
the electronic device mounting substrate according to claim 17; and
an electronic device mounted on the electronic device mounting substrate, the electronic device being electrically connected to the electrode pad.

* * * * *